(12) United States Patent
Kim et al.

(10) Patent No.: US 8,004,480 B2
(45) Date of Patent: Aug. 23, 2011

(54) ORGANIC LIGHT EMITTING DISPLAY

(75) Inventors: Yang Wan Kim, Seoul (KR); Won Kyu Kwak, Gyeonggi-do (KR)

(73) Assignee: Samsung Mobile Display Co., Ltd. (KR)

( * ) Notice: Subject to any disclaimer, the term of this patent is extended or adjusted under 35 U.S.C. 154(b) by 1140 days.

(21) Appl. No.: 11/248,022

(22) Filed: Oct. 11, 2005

(65) Prior Publication Data

US 2006/0123293 A1  Jun. 8, 2006

(30) Foreign Application Priority Data

Oct. 8, 2004 (KR) .................. 10-2004-0080624

(51) Int. Cl.
*G09G 3/32* (2006.01)
(52) U.S. Cl. ........................ 345/82; 345/76
(58) Field of Classification Search .......... 345/82, 345/76, 77, 83
See application file for complete search history.

(56) References Cited

U.S. PATENT DOCUMENTS

| | | | |
|---|---|---|---|
| 6,104,465 A * | 8/2000 | Na et al. ............... | 349/152 |
| 6,556,176 B1 | 4/2003 | Okuyama et al. | |
| 6,924,784 B1 * | 8/2005 | Yeo et al. .............. | 345/98 |
| 2002/0011976 A1 * | 1/2002 | Hashimoto ........... | 345/76 |
| 2002/0036605 A1 | 3/2002 | Kawashima | |
| 2002/0041278 A1 * | 4/2002 | Matsueda ............. | 345/204 |
| 2003/0085885 A1 | 5/2003 | Nakayoshi et al. | |
| 2003/0179164 A1 * | 9/2003 | Shin et al. ............ | 345/76 |
| 2004/0012058 A1 * | 1/2004 | Aoki ..................... | 257/414 |
| 2004/0021816 A1 * | 2/2004 | Jeong et al. .......... | 349/117 |
| 2005/0012454 A1 * | 1/2005 | Yamazaki et al. .... | 313/506 |

FOREIGN PATENT DOCUMENTS

| | | |
|---|---|---|
| CN | 1447302 A | 10/2003 |
| EP | 0275140 A | 7/1988 |
| JP | 63-217326 | 9/1988 |
| JP | 11-085058 | 3/1999 |
| JP | 2002-108247 | 4/2002 |
| JP | 2004-118015 | 4/2004 |
| JP | 2004-206056 | 7/2004 |
| KR | 10-2003-0096878 | 12/2003 |

OTHER PUBLICATIONS

Chinese Office Action issued on Jan. 4, 2008, 26 pages.

* cited by examiner

*Primary Examiner* — Kevin M Nguyen
*Assistant Examiner* — Andre Matthews
(74) *Attorney, Agent, or Firm* — Knobbe Martens Olson & Bear LLP

(57) ABSTRACT

Disclosed is an organic light emitting display which has a scan driver to supply scan signals to a plurality of scan lines, a data driver to supply data signal to output lines, with a demultiplexer on each output line to supply the data signal to a plurality of data lines is disclosed. The display also has a pixel portion comprising pixels connected to the scan lines, the data lines, and pixel power source lines. There is also a power source line placed between the pixel portion and the data driver to supply first power to the pixel power source lines, and a parasitic capacitor formed on each data line to charge voltage corresponding to the data signal. With this configuration, the number of output lines provided in a data driver is decreased, and an image is displayed with uniform brightness.

22 Claims, 10 Drawing Sheets

ORGANIC LIGHT EMITTING DISPLAY

CROSS-REFERENCE TO RELATED APPLICATIONS

This application claims the benefit of Korean Patent Application No. 2004-80624, filed on Oct. 8, 2004, in the Korean Intellectual Property Office, the disclosure of which is incorporated herein by reference.

BACKGROUND

1. Field of the Invention

The present invention relates to an organic light emitting display, and more particularly, to an organic light emitting display in which the number of output lines provided in a data driver is decreased, and an image is displayed with uniform brightness.

2. Discussion of Related Art

Recently, various flat panel displays have been developed, which replace a cathode ray tube (CRT) in a display because the CRT is relatively heavy and bulky. The flat panel display can be one of various technologies, including a liquid crystal display (LCD), a field emission display (FED), a plasma display panel (PDP), and an organic light emitting display (LED).

An organic light emitting display comprises a plurality of organic light emitting diodes, where each organic light emitting diode emits light by electron-hole recombination. Such an organic light emitting display has advantages that include relatively fast response time and that power consumption is relatively low. Generally, the organic light emitting display employs a thin film transistor (TFT) for each pixel to selectively supply current to an organic light emitting diode according to a data signal. When current is supplied, the organic light emitting diode emits light.

FIG. 1 (PRIOR ART) illustrates a conventional organic light emitting display.

Referring to FIG. 1, a conventional organic light emitting display comprises a pixel portion 30 comprising a plurality of pixels 40 formed near intersections of scan lines S1 through Sn and data lines D1 through Dm. The conventional organic light emitting display also has a scan driver 10 to drive the scan lines S1 through Sn, a data driver 20 to drive the data driver D1 through Dm; and a timing controller 50 to control the scan driver 10 and the data driver 20.

The scan driver 10 generates a scan signal in response to a scan control signal SCS transmitted from the timing controller 50, and supplies the scan signals to the scan lines S1 through Sn in sequence. Further, the scan driver 10 generates an emission control signal in response to the scan control signal SCS, and supplies the emission control signals to emission control lines El through En in sequence.

The data driver 20 generates a data signal in response to a data control signal DCS transmitted from the timing controller 50, and supplies the data signals to the data lines D1 through Dm. The data driver 20 also supplies the data signal corresponding to one horizontal line per horizontal period to the data lines D1 through Dm.

The timing controller 50 generates the data control signals DCS and the scan control signals SCS in response to external synchronization signals. The data control signal DCS is transmitted to the data driver 20, and the scan control signal SCS is transmitted to the scan driver 10. Further, the timing controller 50 rearranges external data and supplies it to the data driver 20.

The pixel portion 30 receives external first power VDD and external second power VSS. Here, the first power VDD and the second power VSS are supplied to each pixel 40. Each pixel 40 receives the data signal and displays an image corresponding to the data signal. Further, the emission time of the pixels 40 is controlled in correspondence with the emission control signal.

In the conventional organic light emitting display, the respective pixels 40 are placed near the intersections of the scan lines S1 through Sn and the data lines D1 through Dm. The data driver 20 comprises m output lines to supply the data signals to m data lines D1 through Dm. That is, the data driver 20 of the conventional organic light emitting display should have the same number of output lines as the number of the data lines D1 through Dm. Therefore, the data driver 20 comprises a plurality of data integrated circuits to have m output lines, thereby resulting in a problem of increased production cost. Particularly, as the resolution and the size of the pixel portion 30 increase, the number of output lines of the data driver 20 increases. Thus, the production cost of the organic light emitting display is increased.

SUMMARY OF CERTAIN INVENTIVE EMBODIMENTS

Accordingly, it is an aspect of the present invention to provide an organic light emitting display, in which the number of output lines provided in a data driver is decreased and the image is displayed with uniform brightness.

One embodiment includes an organic light emitting display including a scan driver configured to supply scan signals to a plurality of scan lines, a data driver configured to supply data signals to a plurality of output lines, a plurality of demultiplexers, each configured to selectively supply the data signals from a single output line to a plurality of data lines, a pixel portion including a plurality of pixels, the pixel portion being connected to the scan lines, the data lines, and pixel power source lines, an auxiliary power source line placed between the pixel portion and the data driver to supply a first power to the pixel power source lines, and a plurality of parasitic capacitors each formed from a single data line and the auxiliary power source line in an area where the single data line and the auxiliary power source line overlap. The parasitic capacitors are each configured to store charge corresponding to the data signal on the corresponding data line and at least two of the plurality of parasitic capacitors are formed from the auxiliary power source line and at least two data lines having different widths.

Another embodiment includes an organic light emitting display including a scan driver configured to supply scan signals to a plurality of scan lines, a data driver configured to supply the data signals to a plurality of output lines, a plurality of demultiplexers, each configured to selectively supply data signals from a single output line to a plurality of data lines, a pixel portion including a plurality of pixels, the pixel portion being connected to the scan lines, the data lines, and pixel power source lines, an auxiliary power source line placed between the pixel portion and the data driver to supply a first power to the pixel power source lines. The auxiliary power source line has a center portion wider than an edge portion, and a plurality of parasitic capacitors each formed from a single data line and the power source line in an area where the single data line and the power source line overlap. The parasitic capacitors are each configured to store charge corresponding to the data signal on the corresponding data line.

Another embodiment includes an organic light emitting display including a scan driver configured to supply scan signals to a plurality of scan lines, a data driver configured to supply the data signals to a plurality of output lines, a plurality of demultiplexers, each configured to selectively supply data signals from a single output line to a plurality of data lines, a pixel portion including a plurality of pixels, the pixel portion being connected to the scan lines, the data lines, and pixel power source lines, an auxiliary power source line placed between the pixel portion and the data driver to supply a first power to the pixel power source lines, and a plurality of parasitic capacitors each formed from a single data line and the auxiliary power source line in an area where the single data line and the auxiliary power source line overlap. The parasitic capacitors are each configured to store charge corresponding to the data signal on the corresponding data line and at least two of the plurality of parasitic capacitors are formed from the auxiliary power source line and bending portions of at least two data lines.

Another embodiment includes an organic light emitting display including a scan driver configured to supply scan signals to a plurality of scan lines, a data driver configured to supply data signals to a plurality of output lines, a plurality of demultiplexers, each configured to selectively supply the data signals from a single output line to a plurality of data lines, a pixel portion including a plurality of pixels, the pixel portion being connected to the scan lines, the data lines, and pixel power source lines, an auxiliary power source line placed between the pixel portion and the data driver to supply a first power to the pixel power source lines, and a plurality of parasitic capacitors each formed from a single data line and the auxiliary power source line in an area where the single data line and the auxiliary power source line overlap. The parasitic capacitors are each configured to store charge corresponding to the data signal on the corresponding data line and the surface area of the overlapping area of each of the plurality of parasitic capacitors is substantially equal to the surface area of the overlapping areas of each of the other parasitic capacitors.

BRIEF DESCRIPTION OF THE DRAWINGS

The above and other features and advantages of certain inventive aspects are discussed with further detailed exemplary embodiments with reference to the attached drawings in which.

DETAILED DESCRIPTION OF CERTAIN INVENTIVE EMBODIMENTS

Figure 1:
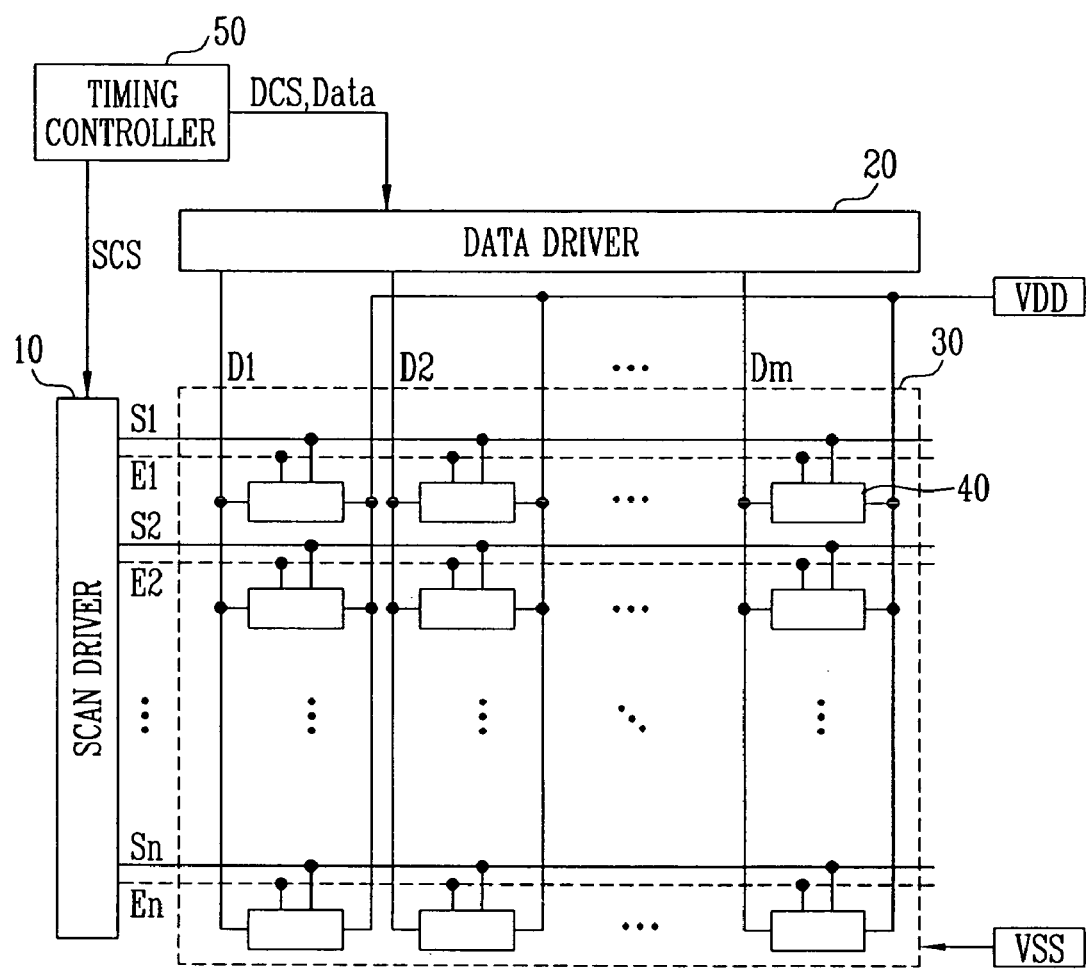
FIG. 1 illustrates a conventional organic light emitting display.

Hereinafter, embodiments according to the present invention will be described with reference to the accompanying drawings. As description herein includes the connection of first and second elements, such description contemplates the embodiments where the first and second elements are connected via a third element. Additionally, like reference numerals refer to like elements throughout.

Figure 2:
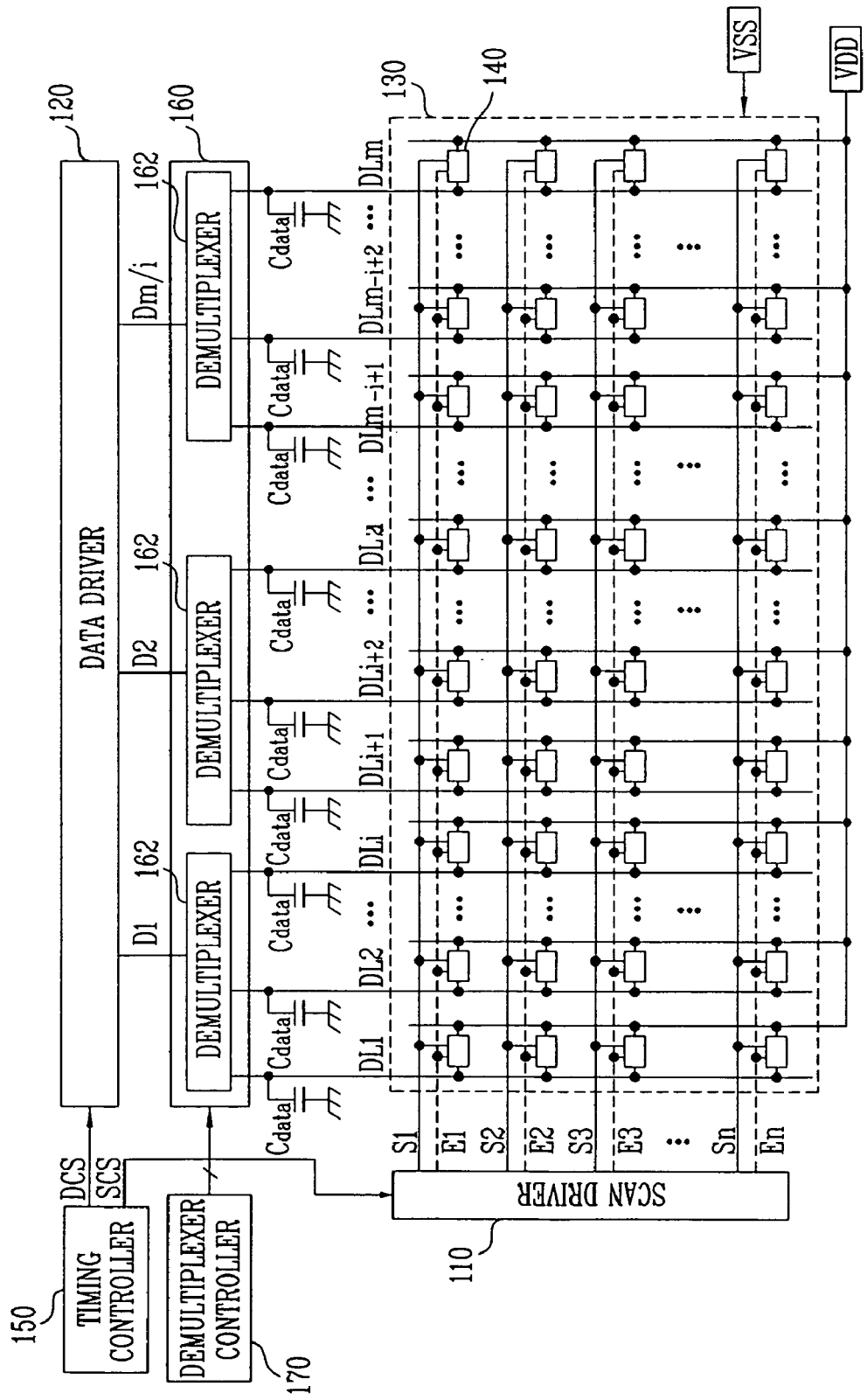
FIG. 2 illustrates an organic light emitting display according to one inventive embodiment.

FIG. 2 illustrates an organic light emitting display according to one inventive embodiment.

Referring to FIG. 2, an organic light emitting display according to one embodiment of the present invention comprises a scan driver 110, a data driver 120, a pixel portion 130, a timing controller 150, a demultiplexing block 160, a demultiplexer controller 170, and a plurality of data capacitors Cdata.

The pixel portion 130 comprises a plurality of pixels 140 placed near the intersections of scan lines S1 through Sn and data lines DL1 through DLm. Each pixel 140 emits light according to a data signal transmitted through the corresponding data line DL.

The scan driver 110 generates a scan signal in response to a scan control signal SCS supplied from the timing controller 150, and supplies the scan signals to the scan lines S1 through Sn in sequence. Here, the scan driver 110 supplies the scan signal during a predetermined period in one horizontal period 1H (Refer to FIG. 4).

For example, the one horizontal period 1H according to one embodiment is divided into a scan period (first period) and a data period (second period). That is, the scan driver 110 supplies the scan signal to the scan lines S during the scan period in the one horizontal period 1H. On the other hand, the scan driver 110 does not supply the scan signal during the data period in the one horizontal period 1H. Further, during the data period the scan driver 119 generates the emission control signals in response to the scan control signals SCS, and supplies the emission control signals to emission control lines E1 through En in sequence.

The data driver 120 generates the data signal in response to a data control signal DCS supplied from the timing controller 150, and supplies the data signals to first data lines D1 through Dm/i. Here, the data driver 120 supplies m/i data signals (where i is a natural number of 2 or more) to the first data lines D1 through Dm/i.

For example, the data driver 120 supplies real data signals R, G, B to the pixel in sequence during the data period in the one horizontal period 1H. Here, the real data signals R, G, B are supplied during only the data period, so that the timing of supplying the real data signals R, G, B are not overlapped with that of supplying the scan signal. Further, the data driver 120 supplies a dummy data signal DD during the scan period in the one horizontal period 1H.

The timing controller 150 generates the data control signals DCS and the scan control signals SCS corresponding to external synchronization signals. The data control signals DCS generated in the timing controller 150 are supplied to the data driver 120, and the scan control signals SCS generated in the timing controller 150 are supplied to the scan driver 110.

The demultiplexer block 160 comprises m/i demultiplexers 162. In other words, the demultiplexer block 160 has the same number of demultiplexers 162 as the number of the first data lines D1 through Dm/i. The m/i demultiplexers 162 are connected to the first data lines D1 through Dm/i, respectively. Further, each demultiplexer 162 is connected to i second data lines DL. Thus, each demultiplexer 162 supplies i data signals received during each data period to i second data lines DL.

Accordingly, as the data signal received through one first data line D is supplied to i second data lines DL, the number of output lines provided in the data driver 120 is decreased by a factor of i. For instance, when i is 3, the number of output lines provided in the data driver 120 is decreased by a factor of 3, and therefore the number of corresponding data integrated circuits provided in the data driver 120 is also decreased i, thereby reducing production cost of the organic light emitting display.

Figure 4:
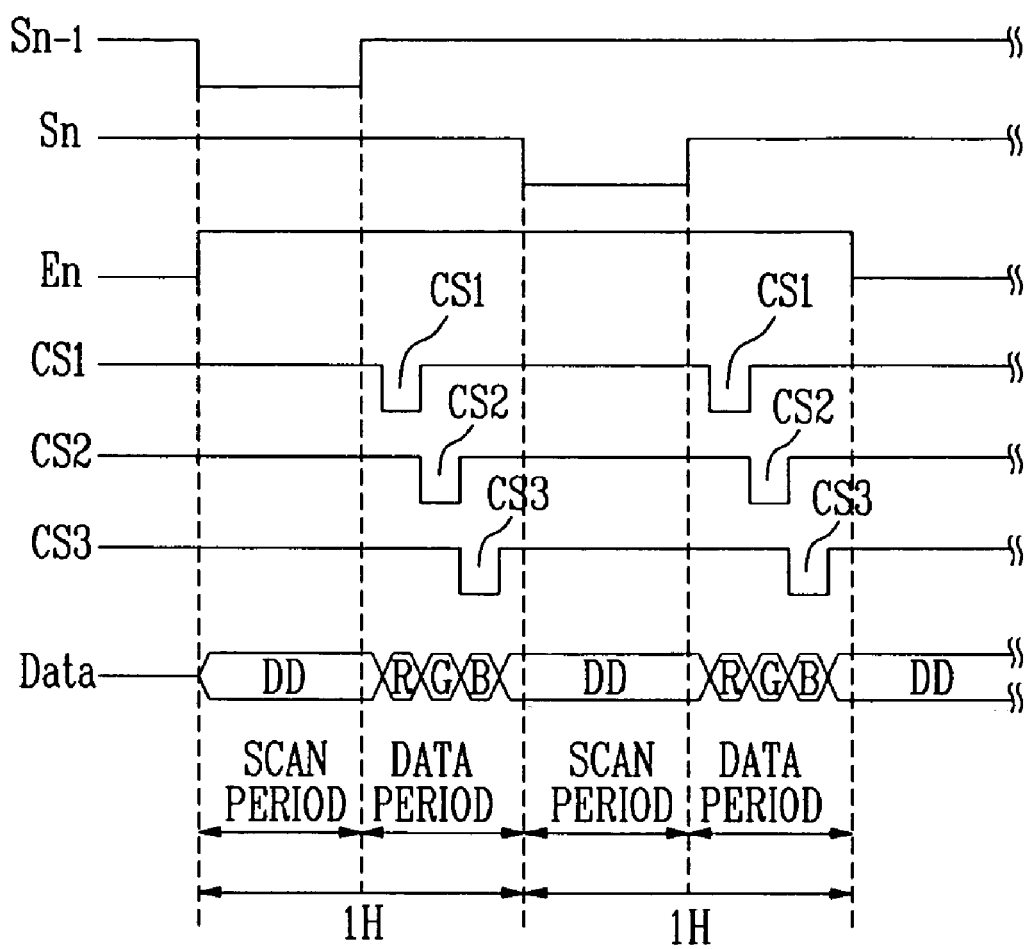
FIG. 4 illustrates waveforms of driving signals supplied to a scan line, a data line and the demultiplexer.

The demultiplexer controller 170 supplies i control signals to the demultiplexers 162 during the data period in the one horizontal period, thereby demultiplexing the data signal into i data signals and supplying i data signals from the first data line D to i second data lines DL. Here, the demultiplexer controller 170 supplies i control signals sequentially, so that the i control signals do not overlap in time, as shown in FIG. 4. In this embodiment, the demultiplexer controller 170 is separate from the timing controller 150, but in other embodiments the demultiplexer controller may be integrated with the timing controller 150.

The data capacitor Cdata is provided in every second data line DL.

Here, the data capacitor Cdata temporarily stores the data signal supplied to the second data line DL, and supplies the stored data signal to the pixel 140. In some embodiments, the data capacitor Cdata is a parasitic capacitor. According to some embodiments, the capacitance of the parasitic capacitor is larger than a storage capacitor Cst provided in every pixel 140 (refer to FIG. 5).

Figure 3:
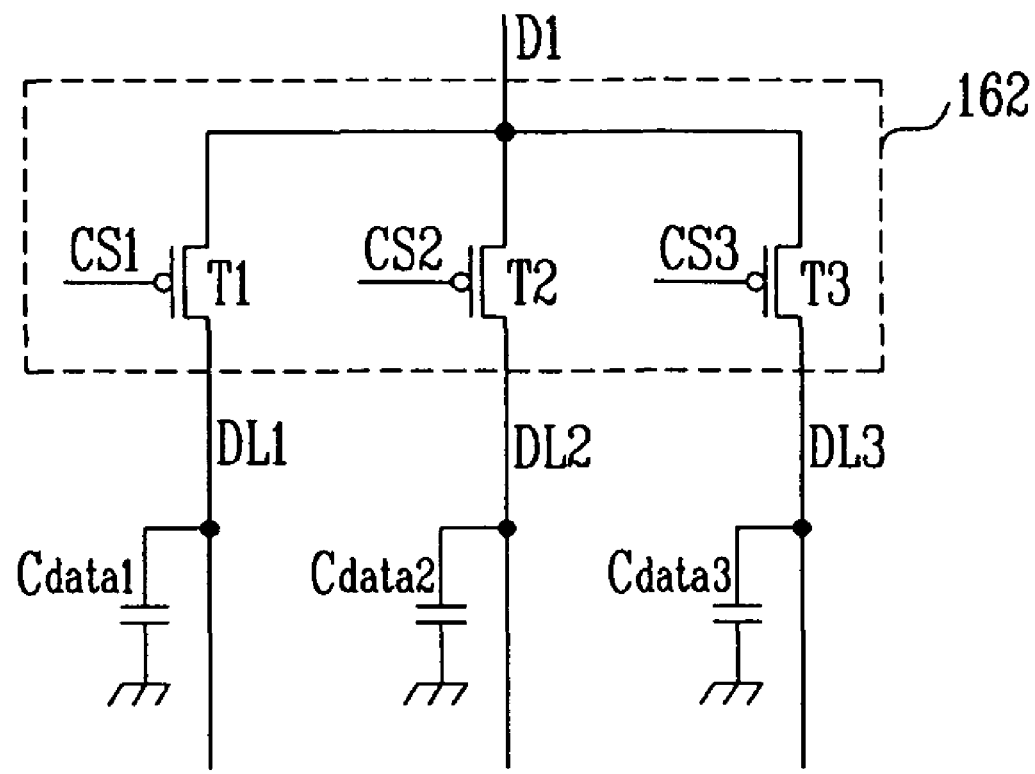
FIG. 3 is a circuit diagram of a demultiplexer illustrated in FIG. 2.

FIG. 3 is a circuit diagram of a demultiplexer illustrated in FIG. 2.

For the sake of convenience, let i be 3. Further, let the demultiplexer shown in FIG. 3 be connected to the $1^{st}$ first data line D1.

Referring to FIG. 3, the demultiplexer 162 comprises a first switching device (or transistor) T1, a second switching device T2, and a third switching device T3.

The first switching device T1 is connected between the $1^{st}$ first data line D1 and the $1^{st}$ second data line DL1. Here, the first switching device T1 is turned on when it receives a first control signal CS1 from the demultiplexer controller 170, and supplies the data signal from the $1^{st}$ first data line D1 to the $1^{st}$ second data line DL1. The data signal supplied to the $1^{st}$ second data line DL1 is temporarily stored in the first data capacitor Cdata1.

The second switching device T2 is connected between the $1^{st}$ first data line D1 and the $2^{nd}$ second data line DL2. Here, the second switching device T2 is turned-on when it receives a second control signal CS2 from the demultiplexer controller 170, and supplies the data signal from the $1^{st}$ first data line D1 to the $2^{nd}$ second data line DL2. The data signal supplied to the $2^{nd}$ second data line DL2 is temporarily stored in the second data capacitor Cdata2.

The third switching device T3 is connected between the $1^{st}$ first data line D1 and the $3^{rd}$ second data line DL2. Here, the third switching device T3 is turned on when it receives a third control signal CS3 from the demultiplexer controller 170, and supplies the data signal from the $1^{st}$ first data line D1 to the $3^{rd}$ second data line DL3. The data signal supplied to the $3^{rd}$ second data line DL3 is temporarily stored in the third data capacitor Cdata3. With this configuration, operations of the demultiplexer 162 will be described in association with configurations of the pixel 140.

Figure 5:
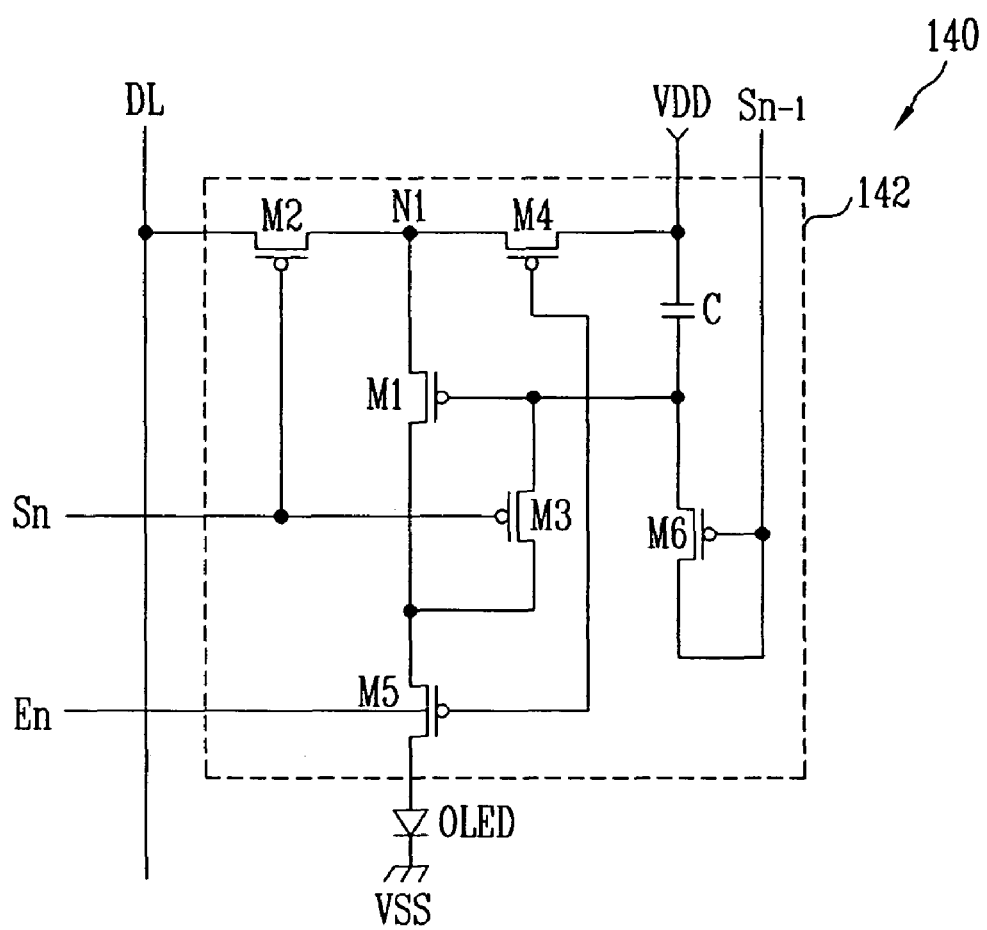
FIG. 5 is a circuit diagram of a pixel illustrated in FIG. 2.

FIG. 5 is a circuit diagram of a pixel illustrated in FIG. 2. Here, the pixel is not limited to the structure shown in FIG. 5. The pixel may, for example, comprise at least one transistor capable of being used as a diode.

Referring to FIG. 5, each pixel 140 according to one embodiment comprises an organic light emitting diode OLED, and a pixel circuit 142, which is connected to the second data line DL, the scan line Sn, and the emission control line En and is configured to control light emission of the organic light emitting diode OLED.

The organic light emitting diode OLED comprises an anode electrode connected to the pixel circuit 142, and a cathode electrode connected to a second power source line VSS. The second power source line VSS is applied with voltage lower than that of a first power source line VDD. For example, ground voltage can be applied to the second power source line VSS. The organic light emitting diode OLED emits light depending on current supplied from the pixel circuit 142. For this, the organic light emitting diode OLED includes fluorescent and/or phosphorescent organic material.

The pixel circuit 142 comprises a storage capacitor C and a sixth transistor M6 which are connected in series between the first power source line VDD and the $(n-1)^{th}$ scan line Sn-1. The pixel circuit 142 also comprises a second transistor M2 and a fourth transistor M4 which are connected in series between the first power source line VDD and the data line DL. A fifth transistor M5 is connected between the organic light emitting diode OLED and the emission control line En, and a first transistor M1 is connected between the fifth transistor M5 and a first node N1. Also a third transistor M3 is connected between gate and drain terminals of the first transistor M1. In the embodiment of FIG. 5, the first through sixth transistors M1 through M6 are of a p-type metal oxide semiconductor field effect transistor (PMOSFET), but other embodiments have other types of switching devices. For example, the first through sixth transistors M1 through M6 may be of an n-type metal oxide semiconductor field effect transistor (NMOSFET). In the case where the first through sixth transistors M1 through M6 are of the NMOSFET, polarity of driving waveforms is reversed as well-known to those skilled in the art.

The first transistor M1 comprises a source terminal connected to the first node N1, the drain terminal connected to a source terminal of the fifth transistor M5, and the gate terminal connected to the storage capacitor C. Further, the first transistor M1 supplies current corresponding to voltage charged in the storage capacitor C to the organic light emitting diode OLED.

The third transistor M3 comprises a drain terminal connected to the gate terminal of the first transistor M1, a source terminal connected to the drain terminal of the first transistor M1, and a gate terminal connected to the $n^{th}$ scan line Sn. Further, the third transistor M3 is turned on when the scan signal is transmitted to the nth scan line Sn, and thus makes the first transistor M1 be connected like a diode. That is, when the third transistor M3 is turned on, the first transistor M1 functions as a diode.

The second transistor M2 comprises a source terminal connected to the data line DL, a drain terminal connected to the first node N1, and a gate terminal connected to the $n^{th}$ scan line Sn. Further, the second transistor M2 is turned on when the scan signal is transmitted to the $n^{th}$ scan line Sn, thereby transmitting the data signal from the data line DL to the first node N1.

The fourth transistor M4 comprises a drain terminal connected to the first node N1, a source terminal connected to the first power source line VDD, and a gate terminal connected to the emission control line En. Further, the fourth transistor M4 is turned on when the emission control signal En is not supplied, thereby electrically connecting the first power source line VDD with the first node N1.

The fifth transistor M5 comprises a source terminal connected to the drain terminal of the first transistor M1, a drain terminal connected to the organic light emitting diode OLED, and a gate terminal connected to the emission control line En.

Further, the fifth transistor M5 is turned on when the emission control signal En is not supplied, thereby supplying current from the first transistor M1 to the organic light emitting diode OLED.

The sixth transistor M6 comprises a source terminal connected to the storage capacitor C, and drain and gate terminals connected to the $(n-1)^{th}$ scan line Sn-1. Further, the sixth transistor M6 is turned on when the scan signal is transmitted to the $(n-1)^{th}$ scan line Sn-1, thereby initializing the storage capacitor C and the gate terminal of the first transistor M1.

Figure 6:
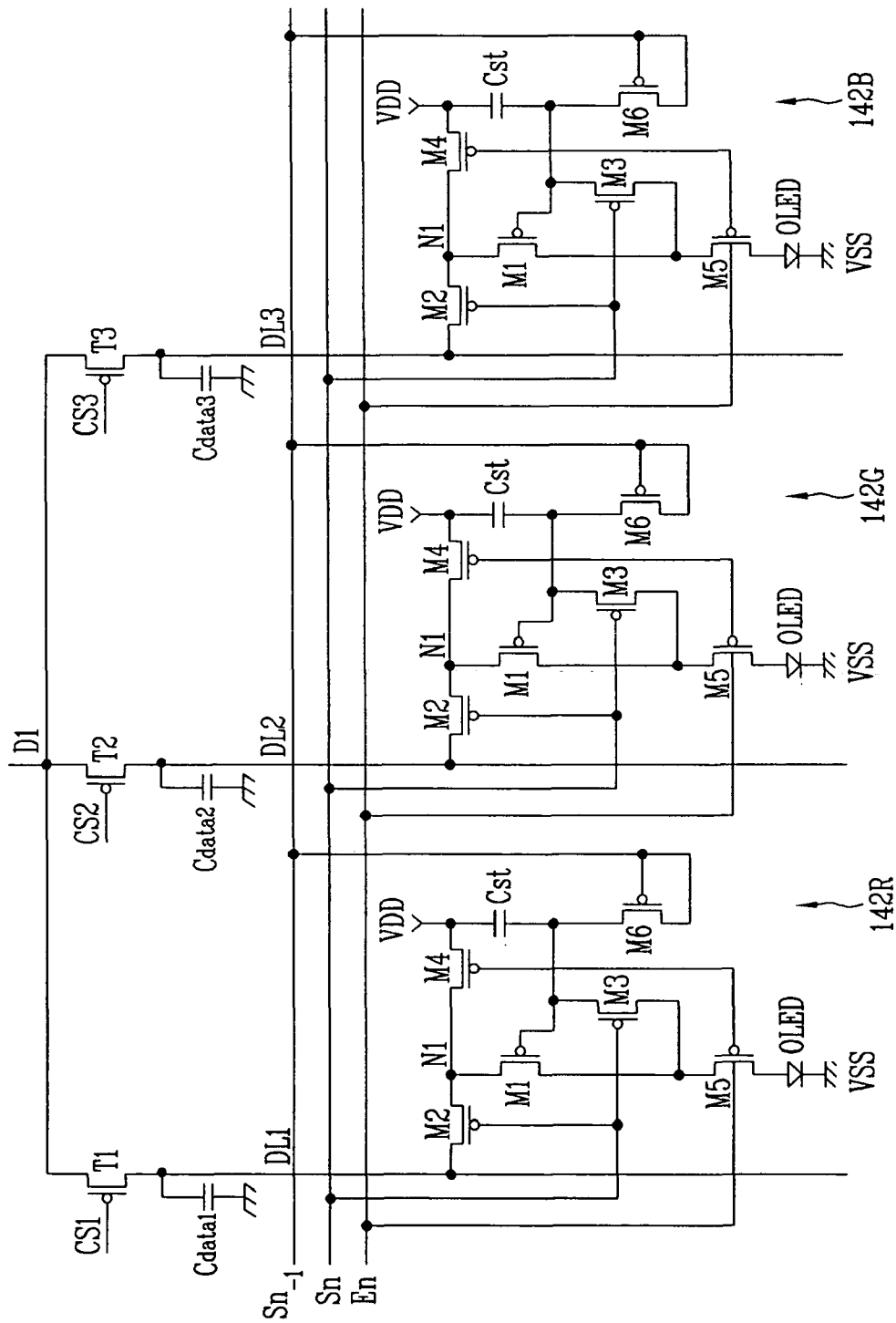
FIG. 6 is a circuit diagram illustrating a connection structure between the demultiplexer of FIG. 3 and the pixel of FIG. 5.

FIG. 6 is a circuit diagram illustrating an embodiment of a connection structure between the demultiplexer of FIG. 3 and the pixel of FIG. 5. Here, one demultiplexer is connected with 3 pixels, one for each of red (R), green (G) and blue (B). i In this embodiment i is 3.

The operations of the demultiplexer 162 and the pixel 140 will be described with reference to FIGS. 4 and 6. First, the scan signal is transmitted to the $(n-1)^{th}$ scan line Sn-1 during the scan period in the one horizontal period. When the scan signal is transmitted to the $(n-1)^{th}$ scan line Sn-1, each sixth transistor M6 of the pixels 142R, 142G and 142B is turned on. According as the sixth transistor M6 is turned on, the storage capacitor C and the gate terminal of the first transistor M1 are connected to the $(n-1)^{th}$ scan line Sn-1. That is, when the scan signal is transmitted to the $(n-1)^{th}$ scan line Sn-1, the scan signal is supplied to each storage capacitor C and each gate terminal of the first transistor M1 provided in the pixels 142R, 142G and 142B, thereby initializing each storage capacitor C and each gate terminal of the first transistor M1. Here, the scan signal SS has a voltage level lower than that of the data signal.

When the scan signal is transmitted to the $(n-1)^{th}$ scan line Sn-1, the second transistor M2 connected to the $n^{th}$ scan line Sn is maintained being turned off.

Then, the first through third switching devices T1 through T3 are turned on in sequence by the first through third control signals CS1 through CS3 transmitted in sequence during the data period. When the first switching device T1 is turned on by the first control signal CS1, the data signal is transmitted from the $1^{st}$ first data line D1 to the $1^{st}$ second data line DL1. At this time, the first data capacitor Cdata1 is charged with voltage corresponding to the data signal transmitted to the $2^{nd}$ second data line DL1.

When the second switching device T2 is turned on by the second control signal CS2, the data signal is transmitted from the $1^{st}$ first data line D1 to the $2^{nd}$ second data line DL2. At this time, the second data capacitor Cdata2 is charged with voltage corresponding to the data signal transmitted to the $2^{nd}$ second data line DL2. When the third switching device T3 is turned on by the third control signal CS3, the data signal is transmitted from the $1^{st}$ first data line D1 to the $3^{rd}$ second data line DL3. At this time, the third data capacitor Cdata3 is charged with voltage corresponding to the data signal transmitted to the $3^{rd}$ second data line DL3. Meanwhile, the scan signal SS is not supplied during the data period, so that the data signal is not supplied to the pixels 142R, 142G and 142B.

Following the data period, the scan signal is transmitted to the $n^{th}$ scan line Sn. When the scan signal is transmitted to the $n^{th}$ scan line Sn, each second transistor M2 and each third transistor M3 of the pixels 142R, 142G and 142B are turned on. According as each second transistor M2 and each third transistor M3 of the pixels 142R, 142G and 142B are turned on, voltages corresponding to the data signals stored in the first through third data capacitor Cdata1 through Cdata3 are supplied to the respective first nodes N1 of the pixels 142R, 142G and 142B.

Here, because the voltage applied to the gate terminal of each first transistor M1 provided in the pixels 142R, 142G and 142B is initialized by the scan signal transmitted to the $(n-1)^{th}$ scan line Sn-1, i.e., is set to have a voltage level lower than that of the data signal applied to the first node N1, the first transistor M1 is turned on. According as the first transistor M1 is turned on, the voltage corresponding to the data signal applied to the first node N1 is supplied to one terminal of the storage capacitor C via the first transistor M1 and the third transistor M3. At this time, each storage capacitor C provided in the pixels 142R, 142G and 142B is charged with voltage corresponding to the data signal. Further, the storage capacitor C is additionally charged with voltage corresponding to the threshold voltage of the first transistor M1 as well as the voltage corresponding to the data signal. Then, while the emission control signal EMI is not supplied through the emission control line E, the fourth and fifth transistors M4 and M5 are turned on, so that current corresponding to the voltage charged in the storage capacitor C is supplied to the organic light emitting diode OLED, thereby allowing the organic light emitting diode OLED to emit light.

Thus, according to one embodiment, the demultiplexer 162 is employed for demultiplexing the data signals from the first data line D1 to i second data lines DL. Further, the data capacitor Cdata is charged with the voltage corresponding to the data signal during the data period. During the scan period, a data signal dependent voltage is transferred to the storage capacitor C. According to an embodiment, the scan period for supplying the scan signal and the data period for supplying the data signal are not overlapped. This insures that the voltage applied to the gate terminal of the third transistor M3 does not allow the first transistor M1 gate voltage to change while the organic light emitting display is displaying an image. Further, the voltages stored in the data capacitors Cdata are supplied to the pixels at the same time, that is, the data signals are supplied to the pixels at the same time, so that the organic light emitting display can display an image with accurate color and brightness.

Meanwhile, according to an embodiment of the present invention, the data capacitors Cdata equivalently formed on the second data line DL should be approximately equal to each other in capacity to display an image with accurate color and brightness. In other words, all data capacitors Cdata should be set to have approximately equal capacity so that each organic light emitting diode OLED emits the same light as the other organic light emitting diodes OLED for the same data signal. To accomplish this, according to one embodiment, the organic light emitting display is proposed to have a layout as shown in FIG. 7.

Figure 7:
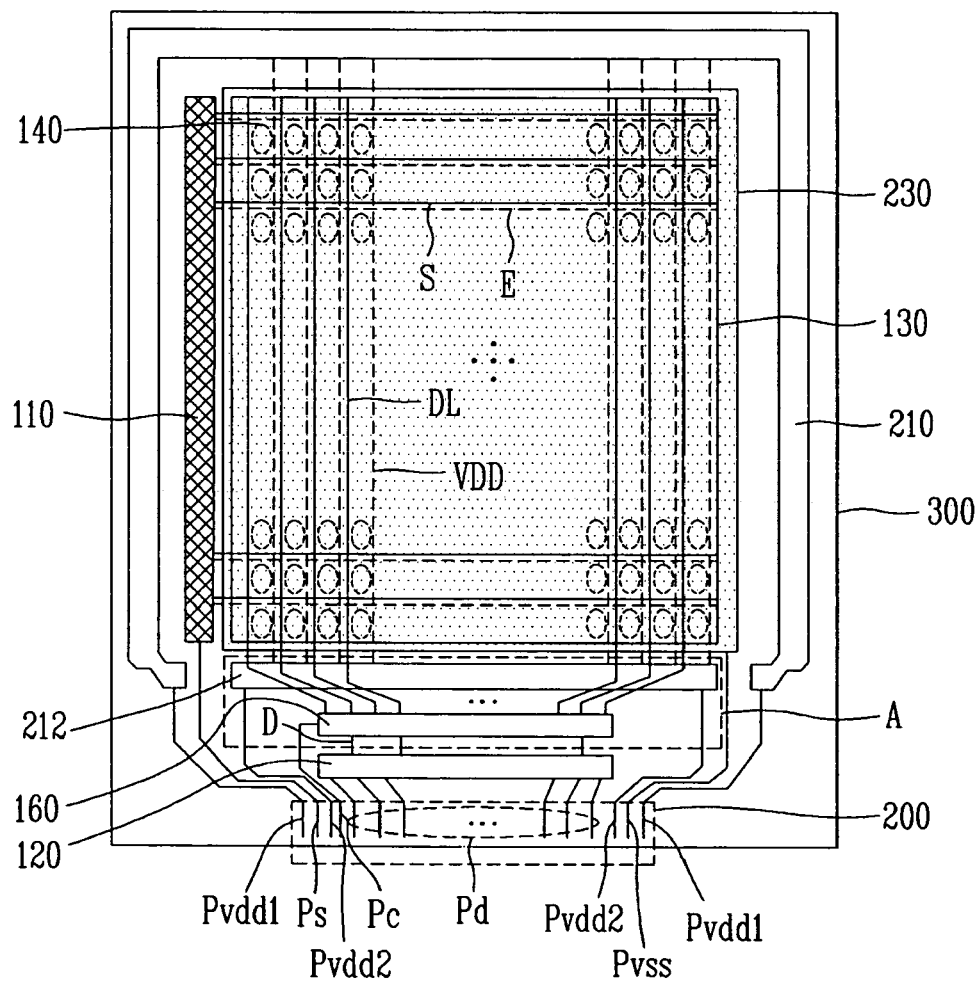
FIG. 7 illustrates a layout of the organic light emitting display according to another inventive embodiment.

FIG. 7 illustrates a layout of the organic light emitting display according to one embodiment.

Referring to FIG. 7, the organic light emitting display according to one embodiment has a pixel portion 130 formed on a substrate 300. The pixel portion 130 has a plurality of pixels 140, a plurality of second data lines DL, a plurality of scan lines S, and a plurality of pixel power source lines VDD. The organic light emitting display also has a first power source line 210 and an auxiliary power source line 212 connected to the pixel power source line VDD, a data driver 120, and a demultiplexer block 160.

According to another embodiment, the organic light emitting display further comprises a scan driver 110, a second power source line 230, and a pad part 200.

The scan driver 110 is disposed in one side of the pixel portion 130 and electrically connected to a first pad Ps of the pad part 200. The scan driver 110 supplies the scan signals to the scan lines S in sequence for the scan period in the one horizontal period 1H in response to the scan control signal SCS supplied from the first pad Ps.

The data driver 120 is electrically connected to second pads Pd of the pad part 200 and the first data line D. The data driver 120 generates a data signal corresponding to the data control signal DCS and data supplied from the second pads Pd, and supplies the generated data signals to the first data lines D. The data driver 120 supplies m/i data signals to the respective first data liens D for the data period in the one horizontal period 1H. The data driver 120 can be directly formed on the substrate 300, or embedded as a chip on the substrate 300. For example, the data driver 120 can be embedded as a chip on the substrate 300 by a chip-on glass method, a wire bonding method, a flip-chip method, a beam lead method, or another method.

The first power source line 210 is formed to be adjacent to opposite and top sides of the pixel portion 130 along the edges of the substrate 300 except the pad part 200. Here, the first power source line 210 comprises opposite ends connected to a third pad Pvdd1 of the pad part 200. Further, the first power source line 210 supplies voltage of the first power VDD received through the third pad Pvdd1 to first ends of the pixel power source lines VDD.

The auxiliary power source line 212 is formed to be adjacent to a bottom side of the pixel portion 130. The auxiliary power source line 212 comprises opposite ends electrically connected to a fourth pad Pvdd2 of the pad part 200. Here, the auxiliary power source line 212 supplies the voltage of the first power VDD received through the fourth pad Pvdd2 to second ends of the pixel power source lines VDD.

The second power source line 230 is formed on the whole area of the pixel portion 130. Here, the second power source line 230 commonly supplies the voltage of the second power VSS received through a fifth pad Pvss of the pad part 200 to each pixel 140.

The demultiplexer block 160 is placed between the data driver 120 and the auxiliary power source line 212. The demultiplexer block 160 supplies mdata signals received through the first data line D to m second data lines DL in response to the control signals CS1, CS2, CS3 transmitted from a sixth pad Pc of the pad part 200. Further, the data signals sequentially supplied from the demultiplexer block 160 are stored in the data capacitor Cdata formed on the second data lines DL, and supplied to the pixels 140. Moreover, as the demultiplexer block 160 is placed between the data driver 120 and the auxiliary power source line 212, the capacitor is formed in a region where the second power source line DL and the auxiliary power source line 212 overlap. This increases the capacitance of the data capacitor Cdata.

The data capacitors Cdata connected to each second data line DL should be approximately equal to each other in capacitance. Therefore, according to one embodiment, the areas in which the second data lines DL are overlapped with the auxiliary power source lines 212 should be approximately equal to each other regardless of positions of the second data lines DL. As a result the data capacitors Cdata have approximately equal capacity, so that each organic light emitting diode OLED emits the same light as the other organic light emitting diodes OLED for the same data signal.

Figure 8:
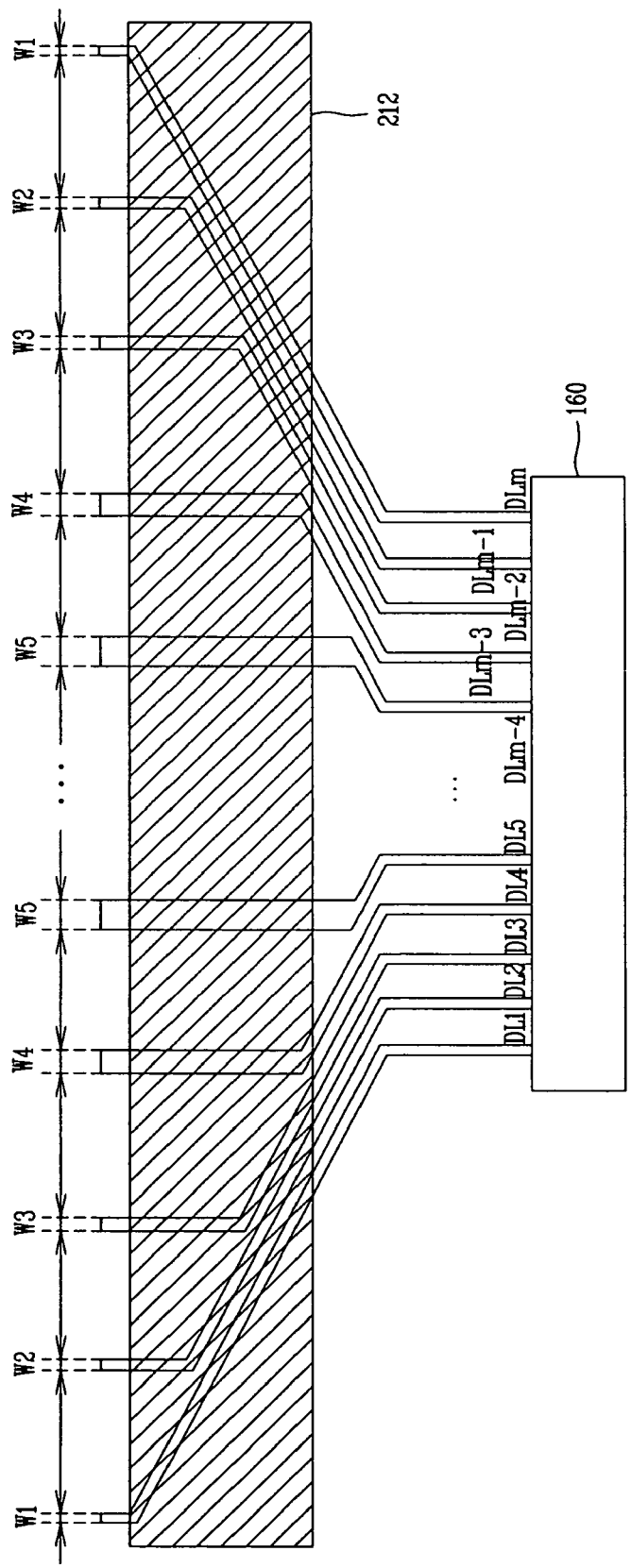
FIG. 8 is an enlarged view showing an embodiment of "A" shown in FIG. 7.

FIG. 8 is an enlarged view showing a first embodiment of "A" shown in FIG. 7.

Referring to FIG. 8, the second data lines DL according to one embodiment various widths so that the areas in which the second data lines DL are overlapped with the auxiliary power source lines 212 are approximately equal to each other regardless of the positions of the second data lines DL.

Further, the length of the demultiplexer block 160 is less than the edge of the pixel portion 130. Therefore, the second data lines DL1 through DLm connected to the demultiplexer block 160 are elongated as they go from a center portion of the demultiplexer block 160 toward an edge portion thereof. For example, the second data line DL formed in the edge portion is twice as long as the second data line DL formed in the center portion.

Therefore, an overlapping length between the second data lines DL1, DLm formed in the edge portions of the demultiplexer portion 160 and the auxiliary power source line 212 is set to be longer than that between the second data lines DLm/2 (not shown) formed in the center portion and the auxiliary power source line 212. However, when the second data lines DL1 through DLm are set to have the same width, the capacity of the data capacitor Cdata equivalently formed on the second data lines DL1 and DLm formed in the edge portions of the auxiliary power source line 212 is larger than that of the data capacitor Cdata equivalently formed on the second data line DLm/2 formed in the center portion of the auxiliary power source line 212, so that an image is displayed with non-uniform brightness. To prevent the image from being displayed with non-uniform brightness, according to an embodiment of the present invention, the width of the second data line DL1 through DLm overlapped with the auxiliary power source line 212 becomes larger as it goes from the edge portions of the auxiliary power source line 212 to the center portion thereof. In other words, the widths of the second data lines DL1 through DLm are set as follows: W1<W2<W3<W4<W5 . . . . Therefore, the second data lines DL1 through DLm are set to have approximately equal capacity regardless of position. As the data capacitors Cdata are set to have approximately equal capacity, the pixel portion 130 can display an image with uniform brightness.

Figure 9:
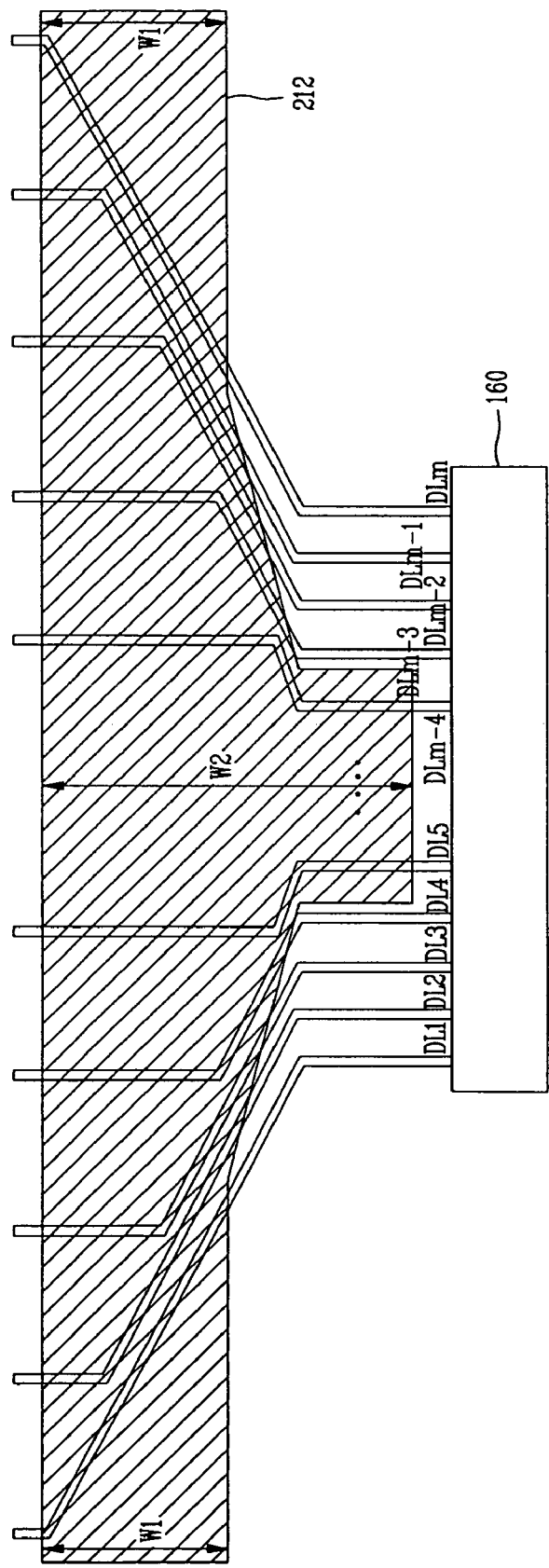
FIG. 9 is an enlarged view showing an embodiment of "A" shown in FIG. 7.

FIG. 9 is an enlarged view showing a second embodiment of "A" shown in FIG. 7.

Referring to FIG. 9, the auxiliary power source line 212 according to another embodiment is sized so that the areas in which the second data lines DL overlap the auxiliary power source lines 212 are approximately equal to each other regardless of the positions of the second data lines DL.

In other words, the auxiliary power source line 212 is set to have the width so that the overlapped area between it and the second data lines DL1 and DLm are approximately equal regardless of second data line position. Accordingly, as shown in FIG. 9, the width of the auxiliary power source line 212 is dependent on position, where it is wider in the center portion than in the outer portions.

The center width W2 of the auxiliary power source line 212 is wider than its edge width W1. Therefore, the overlapped areas between the second data liens DL1 through DLm and the auxiliary power source lines 212 are set to be equal to each other regardless of position. As a result, the data capacitors Cdata formed on the second data lines DL1 through DLm are set to have approximately equal capacitance, thereby allowing the organic light emitting diodes OLED to emit uniform light.

Figure 10:
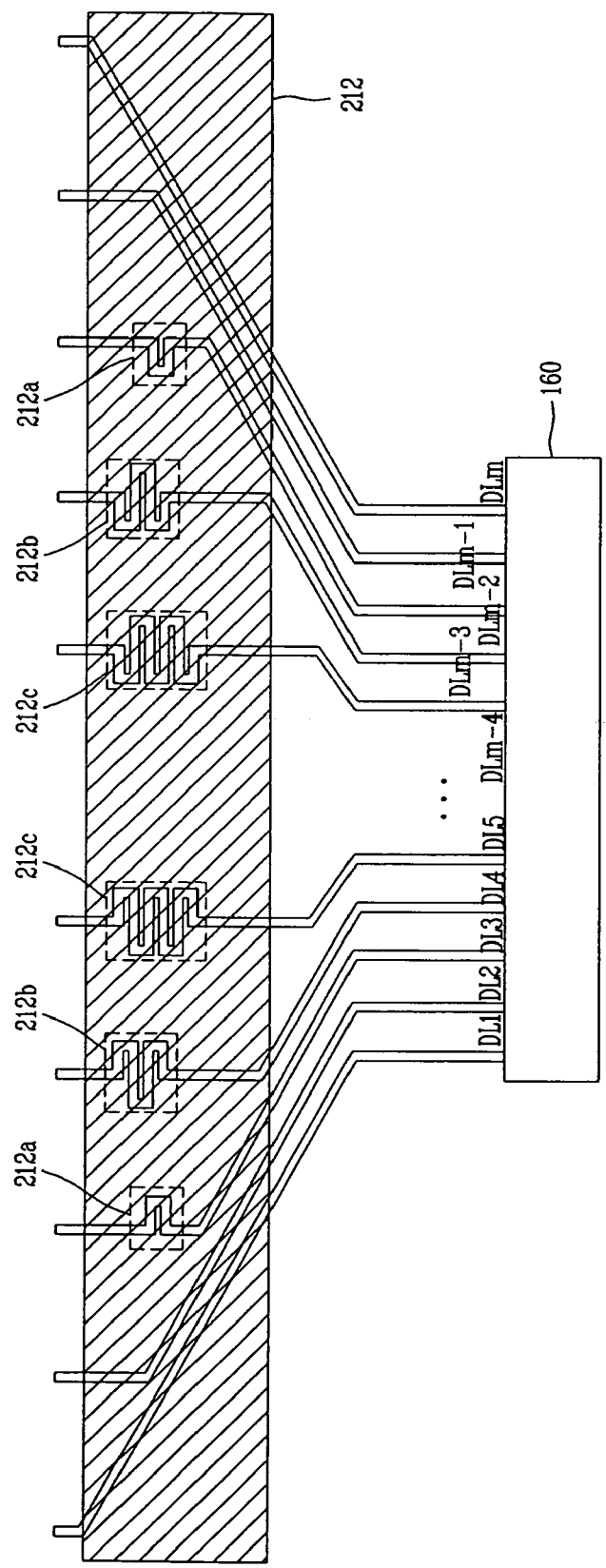
FIG. 10 is an enlarged view showing yet another inventive embodiment of "A" shown in FIG. 7.

FIG. 10 is an enlarged view showing a third embodiment of "A" shown in FIG. 7.

Referring to FIG. 10, at least one of the second data line DL according to one embodiment is set to have bending portions 212a, 212b, 212c, thereby making the areas in which the second data lines DL are overlapped with the auxiliary power source. lines 212 be approximately equal to each other regardless of the positions of the second data lines DL.

Here, the bending portions 212a, 212b, 212c, . . . are formed by zigzag bending the second data line DL, wherein the length bending portions 212a, 212b, 212c, . . . is dependent on position. The lengths are shorter at the edge portions of the auxiliary power source line 212 than at the center portions thereof. As a result, the lengths of the second data lines DL1 through DLm overlapped with the auxiliary power source line 212 are set to be approximately equal to each other regardless of position. Thus, according to one embodiment, the data capacitors Cdata formed on the second data lines DL1 through DLm are set to have approximately equal capacitance, thereby allowing the organic light emitting diodes OLED to emit uniform light.

As described above, an organic light emitting display, in which a data signal received through one output line is demultiplexed and supplied to a plurality of second data lines. This decreases the number of data signal output lines and reduces production cost. Further, according to one embodiment, voltages corresponding to the data signals are sequentially stored in data capacitors, and the voltages are subsequently substantially simultaneously supplied to the pixels. As the voltages charged in the data capacitors are supplied to the pixels at the same time, the pixels display an image with uniform brightness. Further, according to one embodiment, a scan period to supply a scan signal is not overlapped with a data period to supply a data signal. In this manner the image may be stably displayed. Further, according to another embodiment, overlapped areas between an auxiliary power source line and a second data line are set to be equal to each other, so that data capacitors formed on second data lines are approximate equal to each other in capacitance.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. An organic light emitting display comprising:
a scan driver configured to supply scan signals to a plurality of scan lines;
a data driver configured to supply data signals to a plurality of output lines;
a plurality of demultiplexers, each configured to selectively supply the data signals from a single output line to a plurality of data lines;
a pixel portion comprising a plurality of pixels, the pixel portion being connected to the scan lines, the data lines, and a plurality of pixel power source lines;
a first power source line connected to the pixel power source lines at a first end of each of the pixel power source lines; and
a plurality of capacitors, wherein each of the capacitors is configured to store a charge corresponding to the data signal on a corresponding data line,
wherein an auxiliary power source line is placed between the pixel portion and the data driver and is connected to the pixel power source lines at a second end of each of the pixel power source lines,
wherein a first of the capacitors has a first width and a first capacitance, and the first capacitor is formed by a first data line having the first width and the auxiliary power source line, and a second of the capacitors has a second width and a second capacitance, and the second capacitor is formed by a second data line having the second width and the auxiliary power source line, and wherein the first and second widths are different and the first and second capacitances are substantially equal, and
wherein the scan driver supplies the scan signals during a first period defined in one horizontal period, and the data driver supplies the data signals to the plurality of output lines during a second period defined in the one horizontal period, wherein the first and second periods do not overlap.

2. The organic light emitting display according to claim 1, wherein the width of a data line at an edge portion of the auxiliary power source line is less than the width of a data line at a center portion of the auxiliary power source line.

3. The organic light emitting display according to claim 1, wherein each demultiplexer comprises a plurality of transistors, each connected to a separate data line.

4. The organic light emitting display according to claim 3, wherein the plurality of transistors are configured to be turned on in sequence to sequentially supply the data signals to each of the separate different data lines, and the capacitors associated with the corresponding separate data lines are configured to sequentially store charge according to the data signals on the corresponding separate data lines.

5. The organic light emitting display according to claim 4, wherein a voltage stored on a capacitor is supplied to a pixel during the first period.

6. An organic light emitting display comprising:
a scan driver configured to supply scan signals to a plurality of scan lines;
a data driver configured to supply the data signals to a plurality of output lines;
a plurality of demultiplexers, each configured to selectively supply data signals from a single output line to a plurality of data lines;
a pixel portion comprising a plurality of pixels, the pixel portion being connected to the scan lines, the data lines, and a plurality of pixel power source lines;
a first power source line connected to the pixel power source lines at a first end of each of the pixel power source lines; and
a plurality of capacitors, wherein each of the capacitors is configured to store a charge corresponding to the data signal on a corresponding data line,
wherein an auxiliary power source line is placed between the pixel portion and the data driver and is connected to the pixel power source lines at a second end of each of the pixel power source lines,
wherein a first of the capacitors has a first width and a first capacitance, and the first capacitor is formed by a first data line having the first width and the auxiliary power source line, and a second of the capacitors has a second width and a second capacitance, and the second capacitor is formed by a second data line having the second width and the auxiliary power source line, and wherein the first and second widths are different and the first and second capacitances are substantially equal, and wherein the auxiliary power source line has a center portion wider than an edge portion, and
wherein the scan driver supplies the scan signals during a first period defined in one horizontal period, and the data driver supplies the data signals to the plurality of output lines during a second period defined in the one horizontal period, wherein the first and second periods do not overlap.

7. The organic light emitting display according to claim 6, wherein the width of the auxiliary power source line is narrower at an edge portion than at a center portion.

8. The organic light emitting display according to claim 6, wherein each demultiplexer comprises a plurality of transistors, each connected to a separate data line.

9. The organic light emitting display according to claim 8, wherein the plurality of transistors are configured to be turned on in sequence so as to sequentially supply the data signals to each of the separate different data lines, and the capacitors associated with the corresponding separate data lines are configured to sequentially store charge according to the data signals on the corresponding separate data lines.

10. The organic light emitting display according to claim 9, wherein a voltage stored on a capacitor is supplied to a pixel during the first period.

11. An organic light emitting display comprising:
a scan driver configured to supply scan signals to a plurality of scan lines;
a data driver configured to supply the data signals to a plurality of output lines;
a plurality of demultiplexers, each configured to selectively supply data signals from a single output line to a plurality of data lines;
a pixel portion comprising a plurality of pixels, the pixel portion being connected to the scan lines, the data lines, and a plurality of pixel power source lines;
a first power source line connected to the pixel power source lines at a first end of each of the pixel power source lines; and
a plurality of capacitors, wherein each of the capacitors is configured to store a charge corresponding to the data signal on a corresponding data line,
wherein an auxiliary power source line is placed between the pixel portion and the data driver and is connected to the pixel power source lines at a second end of each of the pixel power source lines,
wherein a first of the capacitors has a first width and a first capacitance, and the first capacitor is formed by a first data line having the first width and the auxiliary power source line, and a second of the capacitors has a second width and a second capacitance, and the second capacitor is formed by a second data line having the second width and the auxiliary power source line, and wherein the first and second widths are different and the first and second capacitances are substantially equal, and each of the first and second data lines has a bend, and
wherein the scan driver supplies the scan signals during a first period defined in one horizontal period, and the data driver supplies the data signals to the plurality of output lines during a second period defined in the one horizontal period, wherein the first and second periods do not overlap.

12. The organic light emitting display according to claim 11, wherein a length of one of the data lines at an edge portion of the auxiliary power line than is less than a length of another one of the data lines at a center portion of the auxiliary power line.

13. The organic light emitting display according to claim 11, wherein each demultiplexer comprises a plurality of transistors, each connected to a separate data line.

14. The organic light emitting display according to claim 13, wherein the plurality of transistors are configured to be turned on in sequence so as to sequentially supply the data signals to each of the separate different data lines, and the capacitors associated with the corresponding separate data lines are configured to sequentially store charge according to the data signals on the corresponding separate data lines.

15. The organic light emitting display according to claim 14, wherein a voltage stored on a capacitor is supplied to a pixel during the first period.

16. An organic light emitting display comprising:
a scan driver configured to supply scan signals to a plurality of scan lines;
a data driver configured to supply data signals to a plurality of output lines;
a plurality of demultiplexers, each configured to selectively supply the data signals from a single output line to a plurality of data lines;
a pixel portion comprising a plurality of pixels, the pixel portion being connected to the scan lines, the data lines, and pixel power source lines;
a first power source line connected to the pixel power source lines at a first end of each of the pixel power source lines;
a plurality of capacitors, wherein each of the capacitors is configured to store a charge corresponding to the data signal on a corresponding data line,
wherein an auxiliary power source line is placed between the pixel portion and the data driver and is connected to the pixel power source lines at a second end of each of the pixel power source lines,
wherein a first of the capacitors has a first width and a first capacitance, and the first capacitor is formed by a first data line having the first width and the auxiliary power source line, and a second of the capacitors has a second width and a second capacitance, and the second capacitor is formed by a second data line having the second width and the auxiliary power source line, and wherein the first and second widths are different and the first and second capacitances are substantially equal, and each of the first and second data lines has a bend, and
wherein a length of one of the two data lines at an edge portion of the auxiliary power line is less than a length of another one of the data lines at a center portion of the auxiliary power line, and the surface area of each of the plurality of capacitors is substantially equal to the surface area of each of the other capacitors.

17. The organic light emitting display according to claim 16, wherein the width of a data line at an edge portion of the auxiliary power source line is less than the width of a data line at a center portion of the auxiliary power source line.

18. The organic light emitting display according to claim 16, wherein the width of the auxiliary power source line is narrower at an edge portion than at a center portion.

19. The organic light emitting display according to claim 16, wherein the scan driver supplies the scan signals during a first period defined in one horizontal period, and the data driver supplies the data signals to the plurality of output lines during a second period defined in the one horizontal period, wherein the first and second periods do not overlap.

20. The organic light emitting display according to claim 19, wherein each demultiplexer comprises a plurality of transistors, each connected to a separate data line.

21. The organic light emitting display according to claim 20, wherein the plurality of transistors are configured to be turned on in sequence to sequentially supply the data signals to each of the separate different data lines, and the capacitors associated with the corresponding separate data lines are configured to sequentially store charge according to the data signals on the corresponding separate data lines.

22. The organic light emitting display according to claim 21, wherein a voltage stored on a capacitor is supplied to a pixel during the first period.

* * * * *